April 14, 1964 L. J. KABELL 3,129,391
WIDE DEVIATION FREQUENCY MODULATION SIGNAL GENERATOR
Filed Jan. 28, 1960
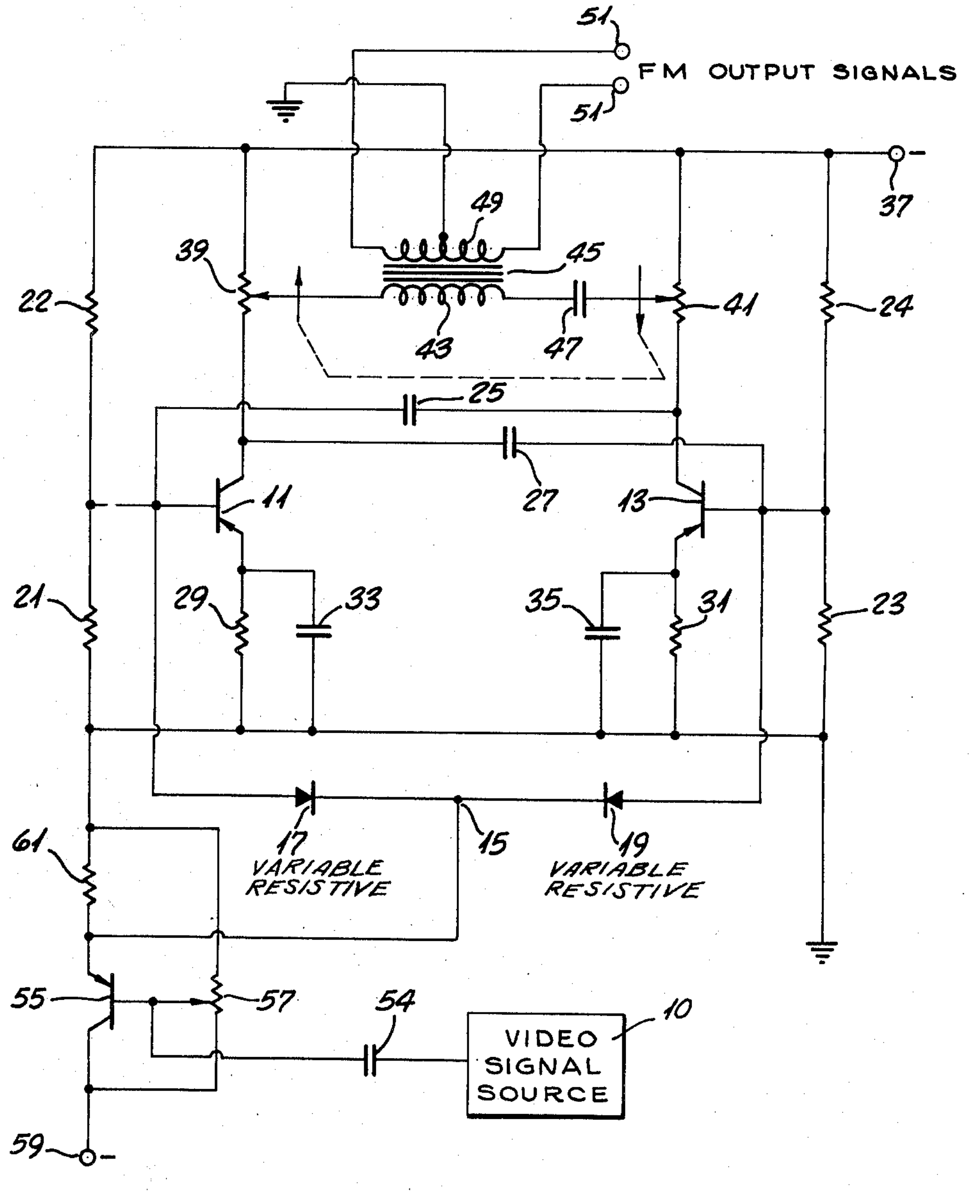
LOUIS J. KABELL
INVENTOR
BY Harvey S. Lamhurst
ATTORNEY 3,129,391
WIDE DEVIATION FREQUENCY MODULATION SIGNAL GENERATOR Louis J. Kabell, Palo Alto, Calif., assignor to Ampex Corporation, Redwood City, Calif., a corporation of California Filed Jan. 28, 1960, Ser. No. 5,165
7 Claims. (Cl. 332—16)

This invention relates to frequency modulated signal generators and more particularly to frequency modulated signal generators capable of large frequency deviation and responsive to modulation frequencies approaching the carrier frequency.

For present purposes, a frequency modulated (FM) signal generator may be considered to be an oscillation generator circuit which responds to a varying amplitude input signal by changing its frequency of oscillation accordingly. An astable or free-running circuit which is arranged to operate at a frequency dependent upon an input signal amplitude has been found to provide a practical basis for FM signal generators capable of frequency deviation approaching 20 percent of the carrier or center frequency. In most applications of wide deviation FM signal generation, the signal generator itself must have good operating characteristics. In frequency modulated recording of television signals on a magnetic tape, these requirements are particularly acute. For example, the modulation response should be linear over the entire range of modulating signal frequencies. The video modulating signal must not be permitted to feed through and mix with the output signal, and the frequency stability and modulation sensitivity must be held to rigid standards in order to provide a clearly reproduced picture with a minimum of ripple and moire effects present.

It is, therefore, a general object of this invention to provide an improved FM signal generator.

It is another object of this invention to provide an FM signal generator capable of wide deviation which is simple and economical to construct.

It is a further object of this invention to provide a wide deviation FM signal generator utilizing semi-conductor components.

It is still a further object of this invention to provide an FM signal generator having good high frequency modulation response, output waveform, frequency stability, and modulation sensitivity with a minimum of video feedthrough or amplitude modulation.

An FM signal generator in accordance with the present invention may achieve these and other purposes by utilizing variable resistance elements in a circuit coupled to the control elements of the amplifier devices of an astable multivibrator type of circuit. In one specific arrangement in accordance with the invention, the amplifier devices may be cross-coupled transistors whose bases are coupled together through a series pair of oppositely poled diodes having an intermediate junction point to which video signals are applied. The diodes are forward biased, and the video signal which causes a frequency modulated signal to be generated is applied to the junction point between the diodes so as to vary the extent of the bias. Changes in the bias modify the resistance coupled to the amplifier devices so as to alter the time constants of the cross-coupling networks and the oscillation frequency of the arrangement.

Further in accordance with the invention, tendencies of the video input signal to feed through to the output are minimized by the use of an output transformer which is coupled in balanced fashion to the output circuits of the two transistors.

A better understanding of the invention may be had by reference to the following description, taken in conjunction with the accompanying drawing, the single figure of which is a schematic circuit diagram of an arrangement in accordance with the invention.

Referring to the drawing, a frequency modulated signal generator including an oscillation generator having the general form of an astable or free-running multivibrator may be frequency controlled by a video signal source 10. The amplifying devices which comprise the principal operating elements in the multivibrator are in a preferred form transistors 11, 13 which are of the PNP conductivity type in the present example. A multivibrator input terminal 15 to which the video input signal is to be applied is coupled between the bases of the transistors 11, 13 through a pair of semi-conductor diodes 17 and 19. The diodes 17, 19 are thus serially connected, but oppositely poled with respect to the junction point 15 between them.

Base bias is provided for a first of the transistors 11 through a voltage divider network consisting of a pair of resistors 21, 22 coupling a source of negative potential 37 to a source of common, or ground potential. The base bias for the second of the transistors 13 is similarly provided by a pair of voltage divider resistors 23, 24 coupling the negative source 37 to ground. The cross couplings which characterize the multivibrator type of circuit are provided by a pair of capacitors 25, 27, each of which couples the base of one of the transistors to the collector of the other. The emitter circuits of the transistors 11, 13 are stabilized by a coupling to ground through parallel circuits including emitter resistors 29, 31 and alternating current by-pass capacitors 33, 35 respectively.

An output circuit provided with this arrangement is disposed in balanced fashion to eliminate in-phase components appearing on the collectors of the transistors 11, 13. The collectors, which constitute the output terminals of the multivibrator circuit itself, are coupled individually to the source of negative potential terminal 37 through differential potentiometer resistances 39 and 41 respectively. The movable contactors of the potentiometers 39, 41 are ganged together for movement in the directions shown by the arrows in the schematic diagram. A transformer 45 having its primary 43 coupled between the contactors of the potentiometers 39, 41 provides the principal element of the output circuit. The coupling between the primary 43 and one of the potentiometers 41 is made through a direct current blocking capacitor 47. The secondary 49 of the transformer 45 is center-tapped, and the center tap is coupled to ground. The opposite ends of the secondary 49 are coupled to the output terminals 51 of the FM signal generator.

An input circuit including the video signal source 10 is coupled to the input terminal 15 of the multivibrator to operate in conjunction with the multivibrator as a frequency modulated signal generator. The input circuit receives a video input signal which is applied from the video signal source 10 through a capacitor 54 to an emitter follower transistor 55, which is selected here to be of the PNP conductivity type. The video input signals are applied to the base of the emitter follower transistor 55, the base also being connected to the contactor of a potentiometer 57, one end of which is coupled along with the collector of the transistor 55 to a negative potential terminal 59. The other end of the potentiometer 57 is coupled to ground. A coupling to ground is also made from the emitter of the emitter follower transistor 55 through a load resistor 61. The emitter of the transistor 55 is directly connected to the input terminal 15 of the multivibrator.

In operation, the circuit generates a normal or center operating frequency which is determined by the time constants of the coupled passive circuits, principally by the relationships of the voltage divider resistors 21 and 22, and 23 and 24, taken together with the cross-connected capacitors 25 and 27. In well known fashion, one of the transistors 11 may conduct while the other transistor 13 is cut off, the interval during which this state is maintained being determined by the time required for a cross-coupled capacitor 25 or 27 to discharge past a given level. Regenerative feedback between the two transistors 11, 13 causes the transistors 11, 13 to switch states of conduction with controlled periodicity. The transistors 11, 13 of the multivibrator need not operate in opposite states of saturation and cut-off, but may instead be biased to switch between varying levels of conduction. The output signal derived from the collectors of the transistors 11, 13 is approximately sinusoidal at the center operating frequency.

In accordance with the present invention, however, the frequency of the multivibrator is also determined by the resistance which is coupled to the bases or control elements of the transistors 11 and 13. A variable resistance is introduced between the bases of the transistors 11, 13 and ground by the diodes 17 and 19 and the coupling to the grounded resistor 61. In the absence of a modulating signal, the resistance presented by the diodes 17, 19 is determined by the setting of the potentiometer 57. The potentiometer 57 setting controls the emitter voltage of the emitter follower transistor 55, and thus the operating voltage and current conditions existing at the multivibrator input terminal 15. The biases established by the voltage divider resistors 21, 22 and 23, 24 and the potentiometer 57 maintain a forward bias on the diodes 17, 19. Preferably, the diodes 17, 19 are biased near the point of maximum curvature of their forward voltage-current characteristic curve. Consequently, a maximum resistance change appears for a given shift of diode operating point.

A video signal applied to the base of the emitter follower transistor 55 causes a corresponding variation in the voltage of the emitter and the terminal 15 between the diodes 17, 19. The forward bias of the diodes 17, 19 and the resistance which they provide vary according to the amplitude of the video signal. This variation of the resistance between the bases of the transistors 11, 13 varies the rate at which the cross-coupling capacitors 25, 27 discharges. The changes in the time constants of the cross-coupling networks therefore change the operating frequency of the multivibrator, so that there is a modulation of the output frequency in response to the applied video signal.

Upon the application of a positive-going video input signal at the input terminal 15, the forward bias of the diodes 17, 19 is reduced. At the same time, the positive-going signal drives the potential of the control elements of the transistors 11, 13 in the direction toward cut-off. As the amount of the positive-going signal is increased in amplitude, the diodes 17, 19 are driven closer to their cut-off point. Consequently, there is less change in the signal appearing at the bases of the transistors 11, 13 for a given change in the input video signal. As a result, the transistors 11, 13 are not driven to cut-off by the positive-going signal but remain in operation regardless of the amplitude of the input signal.

With the diodes 17, 19 polarized as shown, the shift in the operating bias of the transistors 11, 13 at the high end of the frequency excursion is minimized. Thus tendencies of an amplitude modulation to appear in the output signal are also minimized. The circuit has a high modulation sensitivity because of its relatively wide frequency swings for small changes in input signal amplitude.

The application of the input video signal at the input terminal 15 has another effect in addition to variation of the resistance of the diodes 17, 19. An attenuated signal is fed through to the bases of the transistors 11, 13, so that the transistors 11, 13 act as parallel amplifiers of the video signal. The coupling of the output transformer 45, however, effectively eliminates this amplified video feedthrough. The amplified video output signals from the two transistors 11, 13 are in phase, and when applied to the opposite ends of the primary 43 of the transformer 45 the video component cancels. Balance is accomplished by adjustment of the ganged potentiometers 39, 41. The blocking capacitor 47 blocks any D.C. component which may appear on the collectors of the transistors 11, 13. The sine wave signals which appear at the collectors of the transistors 11, 13 and which constitute the principal output of the system are out of phase, so that the signal appearing on the secondary 49 represents only the frequency modulated carrier frequency.

Stabilization is augmented by the use of the relatively low feedback between the transistors 11, 13, in conjunction with the emitter peaking effect provided by the parallel circuits consisting of the resistors 29, 31 with their respective capacitors 33, 35.

A wide deviation frequency modulator in accordance with the above description and drawing was built and operated using the following components:

| | | |
|---|---|---|
| Voltages: | | |
| 37 | v.D.C. | 15 |
| 59 | v.D.C. | 10 |
| Transistors: | | |
| 11 | | 2N247 |
| 13 | | 2N247 |
| 55 | | 2N140 |
| Diodes: | | |
| 17 | | 1N100 |
| 19 | | 1N100 |
| Resistors (ohms): | | |
| 21 | ohms | 15K |
| 22 | do | 75K |
| 23 | do | 15K |
| 24 | do | 75K |
| 29 | do | 910 |
| 31 | do | 910 |
| 39 | do | 500 |
| 41 | do | 500 |
| 57 | do | 10K |
| 61 | do | 3.3K |
| Capacitors: | | |
| 25 | mmf. | 45 |
| 27 | mmf. | 45 |
| 33 | mmf. | 200 |
| 35 | mmf. | 200 |
| 47 | mf. | 0.1 |
| 54 | mf. | 100 |

Transformer: 45 turns ratio 1:1 with center tapped secondary

The circuit as defined above was operated with an input video signal having frequency components from low frequencies to 4.2 megacycles. Unmodulated signal frequency was 5.2 megacycles and deviation as large as one megacycle was obtained. The output signal amplitude varied less than 10% over the full range of frequency excursion.

A number of alternative arrangements will readily suggest themselves to those skilled in the art. For example, NPN conductivity type transistors may be employed instead of the PNP conductivity type shown by merely reversing the collector voltage polarity. If the feedthrough of a video signal is not troublesome, the frequency modulated signal may be taken from the collectors of either of the transistors 11, 13 alone.

Thus, it is seen that a wide deviation FM signal generator has been provided which has good high frequency modulation response, low video signal feedthrough, good output waveform, high frequency stability, high modulation sensitivity, and small amplitude modulation.

What is claimed is:

1. A frequency modulated signal generator comprising an oscillation generator circuit having a nominal operating frequency and including a pair of cross-coupled amplifier devices, said amplifier devices each having an output element and a control element, means for applying a modulating signal to each of said amplifier devices simultaneously including forward biased semi-conductor diodes coupled to the control elements of the amplifier devices, and bias means connected to said means for applying a modulating signal to provide a selected forward bias in the absence of the modulating signal; said forward bias being so selected that the change thereof effected by said modulating signal alters the resistance of said diodes and thus the operating frequency of said signal generator.

2. A frequency modulated signal generator comprising an astable multivibrator circuit having a nominal operating frequency and including a pair of similar transistor amplifier devices with cross-coupled capacitors, said transistor amplifier devices each including at least an output element and a control element, said cross-coupled capacitors being respectively connected between the output element of one transistor and the control element of the other transistor, means including a pair of forward biased semi-conductor diodes coupled between the control elements of the transistor amplifying devices for applying a modulating signal to each of the control elements simultaneously, and a balanced output circuit including a transformer coupled between the output elements of the transistor amplifier devices.

3. A frequency modulated signal generator comprising an astable transistor multivibrator circuit having a nominal operating frequency and including a pair of transistors, each of which has a base, collector and emitter, the multivibrator circuit also including cross-connecting capacitive couplings, a variable resistance circuit coupled between the bases of the transistors, the variable resistance circuit including a pair of oppositely poled semi-conductor diodes coupled in series and having a junction point therebetween, means including a bias circuit coupled to the junction point between the semi-conductor diodes for maintaining the diodes at a region of maximum curvature on their voltage-current characteristic curve, means coupled to the bias circuit to provide a modulating signal to alter the forward bias of the semi-conductor diodes and the resistance presented to the capacitive couplings in the multivibrator circuit, and an output circuit including a transformer having a primary and a center-tapped secondary, the opposite ends of the primary being individually coupled to the collectors of the transistors, and the opposite ends of the secondary providing output terminals between which the frequency modulated signal appears.

4. A frequency modulated signal generation system comprising an astable multivibrator circuit including two cross-connected transistors, said transistors each including at least one control element, and a circuit coupled to vary the frequency of the multivibrator circuit, the circuit being responsive to a modulating video signal and coupling the control elements of the transistors, the circuit including a pair of semi-conductor diodes serially connected between the control elements, and a forward bias source operatively coupled to each of the semi-conductor diodes the diodes being oppositely poled and having a junction therebetween, the junction being coupled to be responsive to the modulating signal; said diodes being so selected that the change thereof effected by said modulating signal alters the resistance of said diodes and thus the operating frequency of said multivibrator circuit.

5. In a frequency modulated oscillation generator circuit having a pair of active switching devices with control elements, cross-coupling circuits of a nominal time constant between said active switching devices, an input, two unidirectional conductive devices in said cross-coupling circuits, one between each said control element and said input a forward bias source operatively coupled to each of said unidirectional conductive devices, said unidirectional conductive devices being so selected and said cross-coupling circuits being so arranged that the effect of said input on said unidirectional conductive devices varies the resistance of said unidirectional conductive devices and thus causes variation of said time constant.

6. A frequency modulated signal generator comprising an astable multivibrator circuit having a nominal operating frequency and including a pair of similar transistor amplifier devices with cross-coupled capacitors, said transistor amplifier devices each including at least an output element and a control element, said cross-coupled capacitors being respectively connected between the output element of one transistor and the control element of the other transistor, means including a pair of forward biased semi-conductor diodes coupled between the control elements of the transistor amplifying devices for applying a modulating signal to each of the control elements simultaneously, and an output circuit including two potentiometers, one coupled to the output terminals of each said transistor amplifying device, a transformer having two windings, one winding of said transformer being connected between the movable contactors of said potentiometer and the other winding of said transformer being center-tapped to ground and having the ends thereof constituting the final frequency modulated output of said signal generator.

7. A frequency modulated signal generator comprising an astable multivibrator circuit having a nominal operating frequency and including a pair of similar transistor amplifier devices with cross-coupled capacitors, said transistor amplifier devices each including at least an output element and a control element, said cross-coupled capacitors being respectively connected between the output element of one transistor and the control element of the other transistor, means including a pair of forward biased semi-conductor diodes coupled between the control elements of the transistor amplifying devices for applying a modulating signal to each of the control elements simultaneously, and an output circuit including two ganged potentiometers, one coupled to the output terminals of each said transistor amplifying device, a transformer having two windings, one winding of said transformer being connected between the movable contactors of said potentiometers in series with a D.C. blocking capacitor and the other winding of said transformer secondary being center-tapped to ground and having its ends constituting the final frequency modulated output of said signal generator.

References Cited in the file of this patent

UNITED STATES PATENTS

| | | |
|---|---|---|
| 2,861,200 | Henle et al. | Nov. 18, 1958 |
| 2,887,663 | Gates | May 19, 1959 |
| 2,900,606 | Faulkner | Aug. 18, 1959 |
| 2,918,587 | Rector et al. | Dec. 22, 1959 |
| 2,956,241 | Huang | Oct. 11, 1960 |
| 3,010,078 | Stefanov | Nov. 21, 1961 |
| 3,020,493 | Carroll | Feb. 6, 1962 |
| 3,061,800 | Matzen | Oct. 30, 1962 |